United States Patent
Picciotto et al.

(10) Patent No.: US 7,429,864 B2
(45) Date of Patent: Sep. 30, 2008

(54) SYSTEMS AND METHODS FOR RECTIFYING AND DETECTING SIGNALS

(75) Inventors: Carl E. Picciotto, Menlo Park, CA (US); Peter George Hartwell, Sunnyvale, CA (US)

(73) Assignee: Hewlett-Packard Development Company, L.P., houston, TX (US)

( * ) Notice: Subject to any disclaimer, the term of this patent is extended or adjusted under 35 U.S.C. 154(b) by 600 days.

(21) Appl. No.: 11/015,060

(22) Filed: Dec. 17, 2004

(65) Prior Publication Data

US 2006/0134869 A1 Jun. 22, 2006

(51) Int. Cl.
 *G01R 31/26* (2006.01)
(52) U.S. Cl. .................... 324/658; 324/76.11; 324/765; 324/158.1
(58) Field of Classification Search ................. 324/658, 324/76.11, 765, 158, 158.1; 438/14, 141
See application file for complete search history.

(56) References Cited

U.S. PATENT DOCUMENTS

| | | | |
|---|---|---|---|
| 5,986,381 A | 11/1999 | Hoen et al. | |
| 6,072,686 A | 6/2000 | Yarbrough | |
| 6,128,214 A | 10/2000 | Kuekes et al. | |
| 6,137,206 A | 10/2000 | Hill | |
| 6,256,767 B1 | 7/2001 | Kuekes et al. | |
| 6,314,019 B1 | 11/2001 | Kuekes et al. | |
| 6,366,186 B1 | 4/2002 | Hill et al. | |
| 6,509,620 B2 | 1/2003 | Hartwell et al. | |
| 6,511,894 B2 | 1/2003 | Song | |
| 6,512,119 B2 | 1/2003 | Bratkovski et al. | |
| 6,559,468 B1 | 5/2003 | Kuekes et al. | |
| 6,586,965 B2 | 7/2003 | Kuekes | |
| 6,624,002 B2 | 9/2003 | Bratkovski et al. | |
| 6,674,932 B1 | 1/2004 | Zhang et al. | |
| 6,760,245 B2 | 7/2004 | Eaton, Jr. et al. | |
| 6,985,002 B2 * | 1/2006 | Salcedo | 324/765 |
| 2002/0075029 A1 * | 6/2002 | Donners | 324/765 |
| 2002/0167380 A1 | 11/2002 | Kang et al. | |
| 2002/0190267 A1 | 12/2002 | Robertson | |
| 2004/0104444 A1 | 6/2004 | Wachtmann et al. | |
| 2005/0148121 A1 * | 7/2005 | Yamazaki et al. | 438/149 |

FOREIGN PATENT DOCUMENTS

| | | |
|---|---|---|
| EP | 1119012 | 7/2001 |
| GB | 2384363 | 7/2003 |
| WO | WO 02/43089 | 5/2002 |
| WO | WO 03/085442 | 10/2003 |
| WO | WO 03/098732 | 11/2003 |

OTHER PUBLICATIONS

S. Hoen et al., "A High-Performance Dipole Surface Drive for Large Travel and Force", Transducers '03, The 12th International Conference on Solid State Sensors, Actuators and Microsystems, Boston, Jun. 8-12, 2003, pp. 344-347.

* cited by examiner

*Primary Examiner*—Vincent Q Nguyen (57) ABSTRACT

A first device has a surface and includes a plurality of at largest micrometer-scale geometry structures extending along its surface. The structures have a first portion and a second portion. A plurality of at largest micrometer-scale geometry conductors are coupled to the first portion of respective structures. A converter converts a signal in the first portion of the structures to a substantially direct current signal in the respective second portion. A sensor detects a level of a signal coupled from one of the conductors to a respective one of the structures.

37 Claims, 9 Drawing Sheets

SYSTEMS AND METHODS FOR RECTIFYING AND DETECTING SIGNALS

CROSS REFERENCE

This application is related to the following U.S. patent applications which are filed on even date herewith and which are incorporated herein by reference: Ser. No. 11/015,934, filed Dec. 17, 2004, entitled SIGNAL CONDUCTION FOR DOPED SEMICONDUCTORS; Ser. No. 11/015,468, filed Dec. 17, 2004, entitled SYSTEMS AND METHODS FOR ELECTRICALLY COUPLING WIRES AND CONDUCTORS, now U.S. Pat. No. 7,391,090; and Ser. No. 11/016,131, filed Dec. 17, 2004, entitled METHODS AND SYSTEMS FOR ALIGNING AND COUPLING DEVICES.

BACKGROUND

Integrated circuits have dominated the electronics industry for many years. Many applications require the use of multiple integrated circuits in combination. Signals between these multiple integrated circuits are connected in order for them to perform their intended function. Various connection means have been used to connect signals in integrated circuits.

Wire bonding is one method for connecting signals between integrated circuits. Each integrated circuit may include a wire bonding pad. An electrical interconnection between the integrated circuits is made by connecting a thin wire between the wire bonding pads. As the size of integrated circuits decreases, the space used for wire bonding techniques, such as for the bonding pads and the fan-out structures to bring signals to the bonding pads, becomes a larger proportion of entire integrated circuit surface.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some general concepts of the invention in a simplified form as a prelude to the more detailed description that is presented later.

In one embodiment, the invention encompasses a first device having a plurality of at largest micrometer-scale geometry structures. The structures have a first portion and a second portion. A plurality of at largest micrometer-scale geometry conductors are coupled to the first portion of respective structures. A converter converts a signal in the first portion of the structures to a substantially direct current signal in the respective second portion. A sensor detects a level of a signal coupled from one of the conductors to a respective one of the structures.

In another embodiment, the invention encompasses a method for determining the impedance of one of a plurality of adjacent at largest micrometer-scale geometry structures of a first device. The structures have a first portion and a second portion. A plurality of at largest micrometer-scale geometry conductors are coupled to the first portion of respective structures. A signal is transmitted from the conductors to a first portion of the respective structures. The signal in the first portion of the structures is converted into a substantially direct current signal in the respective second portion. The level of the signal from one of the conductors to a respective one of the structures is detected and an impedance value corresponding to the respective one of the structures in generated in response to the detected level of the signal.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION

Figure 1A:
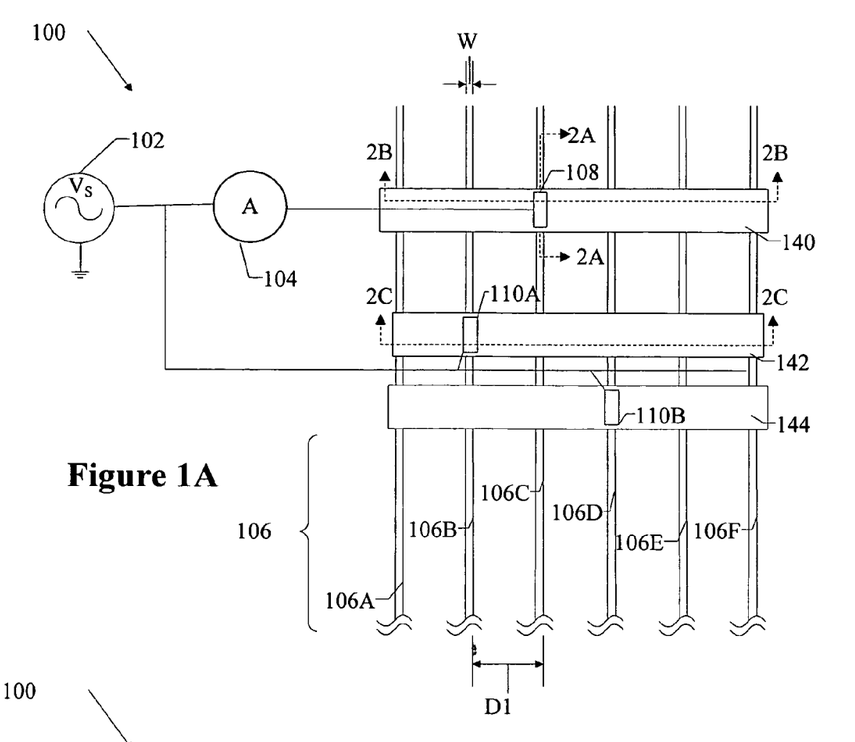
FIGS. 1A and 1B are top views of a portion of a system according to an embodiment of the invention in a first position and a second position, respectively, according to an embodiment of the invention.
Figure 1B:
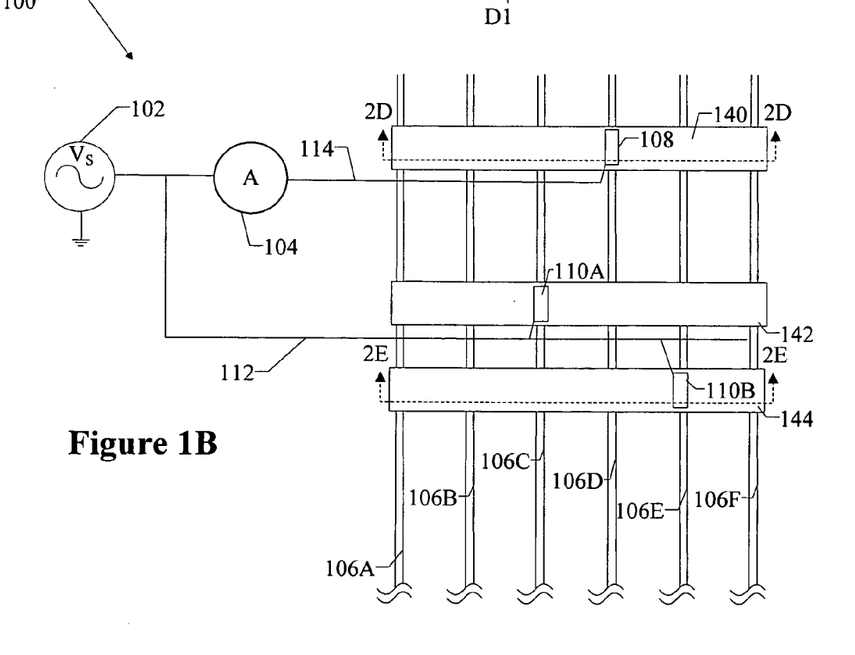
Figure 2A:
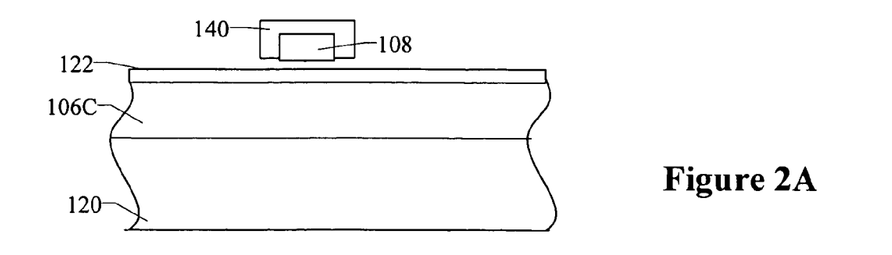
FIGS. 2A-E are cross sectional views of the portion of the system shown in FIGS. 1A and 1B taken along lines 2A-2A, 2B-2B, 2C-2C, 2D-2D, and 2E-2E, respectively, according to an embodiment of the invention.
Figure 2B:
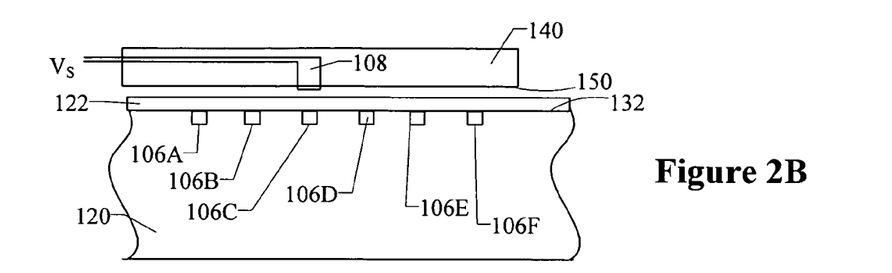
Figure 2C:
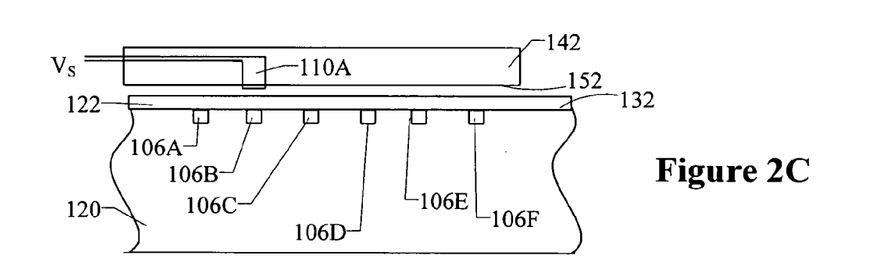
Figure 2D:
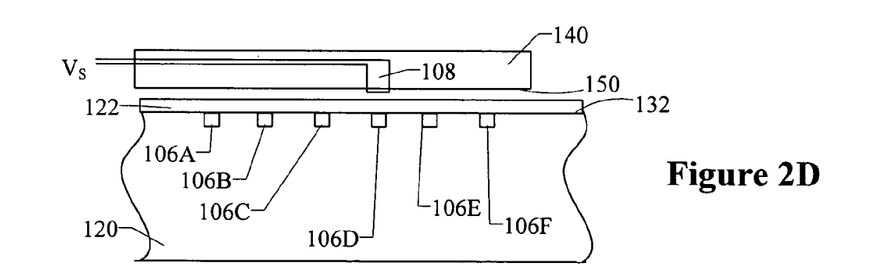
Figure 2E:
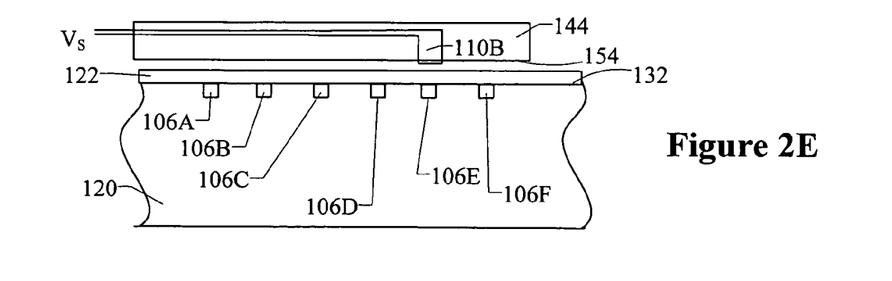

Referring to the drawings, in which like reference numerals indicate like elements, FIGS. 1A-B show top views of a portion of a system 100 according to an embodiment of the invention. The system 100 includes a first device 120, which provides a substrate having a surface 132. The device 120 may essentially constitute a substrate for other components of the system 100, or the device 120 may be a device having other functions. A plurality of micrometer-scale or smaller geometry structures 106A-F (collectively 106) extend along the surface 132. In the embodiment shown in FIGS. 1A-B, the structures 106 comprise conductive tracks laid along the surface 132.

Cross-sectional views of the system 100 taken along lines 2A-2A, 2B-2B, 2C-2C, 2D-2D, and 2E-2E are shown in FIGS. 2A-E, respectively. The portion of the system 100 shown in FIGS. 1A-B and 2A-E is described below with reference to FIGS. 1A-B and 2A-E. The system 100 includes additional components that, in an embodiment, may be substantially the same as the converter 320 shown in FIG. 3, the diode 134 shown in FIG. 4, the converter 720 shown in FIG. 7, or the converter 722, 724, 726 shown in FIGS. 8 and 9D. Those components are described below with reference to the respective drawings.

In the embodiments shown in FIGS. 1A and 1B, the structures 106A-F are formed within the device 120 and are positioned so they are substantially flush with the surface 132 of the device 120. Embodiments of the invention encompass different positioning of the structures 106 and the term "along the surface" encompasses embodiments where the structures 106 are within the device or substrate 120, are flush or substantially flush with the surface 132 of the device 130, and extend past the surface 132 of the device 130.

A plurality of micrometer-scale or smaller geometry conductors 108, 110A-B, collectively 110 are positioned so they are coupled to respective structures 106. For example, in the position shown in FIG. 1A, conductor 110A is coupled to structure 106B, conductor 110B is coupled to structure 106D, and conductor 108 is coupled to structure 106C. In the embodiment of the invention shown in FIGS. 1A-B and 2A-E, the conductors 108, 110 extend through a device 140, 142, 144 to a position in proximity to a surface 150, 152, 154 of the device. The position in proximity to the surface 150, 152, 154 may be within the device, substantially flush with the surface, or past the surface of the device.

A system according to an embodiment of the invention detects or measures a property or attribute of the structures 106. In the embodiment of the invention shown in FIGS. 1A and 1B, the system 100 characterizes a structure by stimulating it with a signal and measuring the resulting current to determine the impedance of the structure 106.

In FIG. 1A, a voltage or signal source 102 generates a signal $V_S$ that is applied to or coupled to a conductor 108. The conductor 108 is coupled to the structure 106C that is to be characterized, to transmit the signal received from the source 102 to the structure 106C. A sensor determines the level of the signal applied to the conductor 106C. In the embodiment of the invention shown in FIG. 1A, the sensor of the system 100 is a current sensor 104 that detects the current of the signal applied to the structure 106C. The impedance of the structure 106C is then determined by a controller 514 based on the detected current as further described below with reference to FIG. 5.

In an embodiment of the invention, the structures 106 have a width W less than or equal to 100 nm, and may have a width less than 10 nm, and the structures 106 are spaced apart by a distance D1. When the structures 106 are spaced close together and there is a difference between the energies of the signal applied to proximate structures, a portion of the signal energy applied to one structure, for example, structure 106C, may get across or transfer to proximate structures 106A-B, 106D-E, e.g., by leakage or coupling from one structure to another. The transference is commonly referred to as crosstalk.

When a significant fraction of the signal applied to the structure 106C in FIG. 1A leaks or is coupled to other structures 106A,B,D,E, the current measured by the sensor 104 may not be an accurate measure of the current through the structure 106C because the measured current will include a component resulting from current that does not flow through the structure 106C and instead flows through other nearby structures 106A,B,D,E. The effect of crosstalk is reduced according to an embodiment of the invention by applying the signal $V_S$ not only to the structure (106C in FIG. 1A) in which the current is being measured by sensor 104, but simultaneously to structures (106B and 106D in FIG. 1A) that are relatively proximate to the structure 106C. The signal current applied to the proximate structures 106B, 106D is not measured by the sensor 104. This technique, sometimes referred to as active guarding, reduces or eliminates crosstalk between structures so the impedance of a particular structure 106C may be more accurately determined. According to another embodiment, the signal $V_S$ is applied not to the immediately adjacent structures 106B, 106D but to other structures 106A, 106E that are proximate to the immediately adjacent structures.

In the embodiment shown in FIG. 1A for characterizing structure 106C, the signal $V_S$ is applied to structure 106C via conductor 108 and is applied to structures 106B,D adjacent to structure 106C via conductors 110A and 110B, respectively. The conductors 108, 110 are shown in a first position in FIG. 1A to characterize structure 106C and in a second position in FIG. 1B to characterize structure 106D. In the embodiment shown in FIG. 1B for characterizing structure 106D, the signal $V_S$ is applied to structure 106D via conductor 108 and is applied to structures 106C,E adjacent to structure 106D via conductors 110A and 110B, respectively.

In an embodiment of the invention, signals are capacitively coupled from the conductors 108, 110 to the structures 106. The embodiment shown in FIGS. 2A-2E includes a dielectric layer 122 separating the conductors 108, 110 from the structures 106. In another embodiment of the invention (not shown), the dielectric 122 is not present and signals are coupled from the conductors 108, 110 to the structures 106 via direct contact between the conductors 108, 110 and the structures 106. In an embodiment of the invention, the devices 120, 140, 142, 144 may be displaced relative to each other to align one or more conductors 108, 110 with the structures 106 to characterize one of the structures 106, for example, structure 106C in FIGS. 1A and 2B-C, and then further displace the devices 120, 140, 142, 144 relative to each other to align the conductors 108, 110 with other structures 106 to characterize a different one of the structures 106, for example, structure 106D in FIGS. 1B and 2D-E.

In FIGS. 1A and 1B the conductors 108, 110A, and 110B are each formed through a respective device 140, 142, 144 that may be independently displaced. Embodiments of the invention encompass having one or more conductors formed in a single device (see FIG. 9A).

The technique of active guarding as described above theoretically assumes that ideally the impedances of the structures 106 are substantially the same and the currents flowing in the structures 106 are substantially the same. The impedance of one structure 106 may be different from the impedance of another structure 106 due to manufacturing tolerances, for example. When the impedances differ among structures, although the same $V_S$ is coupled to the structures, the level or strength of the resulting signal at some position along the length of one structure may be different from the level or strength of the signal at the corresponding position along the length of a proximate structure. This difference may result in crosstalk that will reduce the accuracy of the measured current value and the resulting determined impedance value. The crosstalk may diminish if the impedances of the structures 106 are similar, and if the impedances are low, so that differential currents give rise to only small differential voltages.

Figure 3:
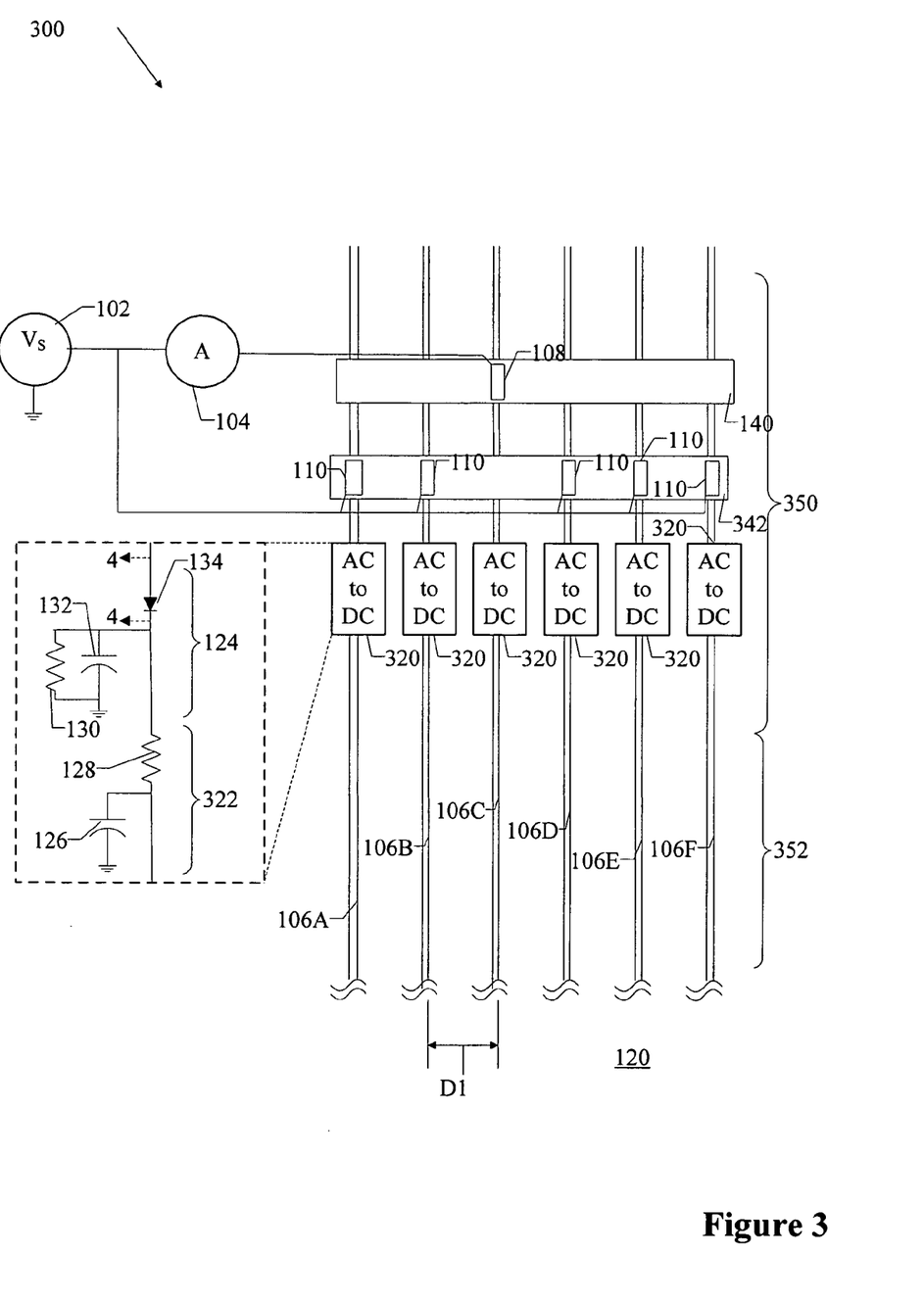
FIG. 3 is a top view of a portion of a system according to an embodiment of the invention.
Figure 4:
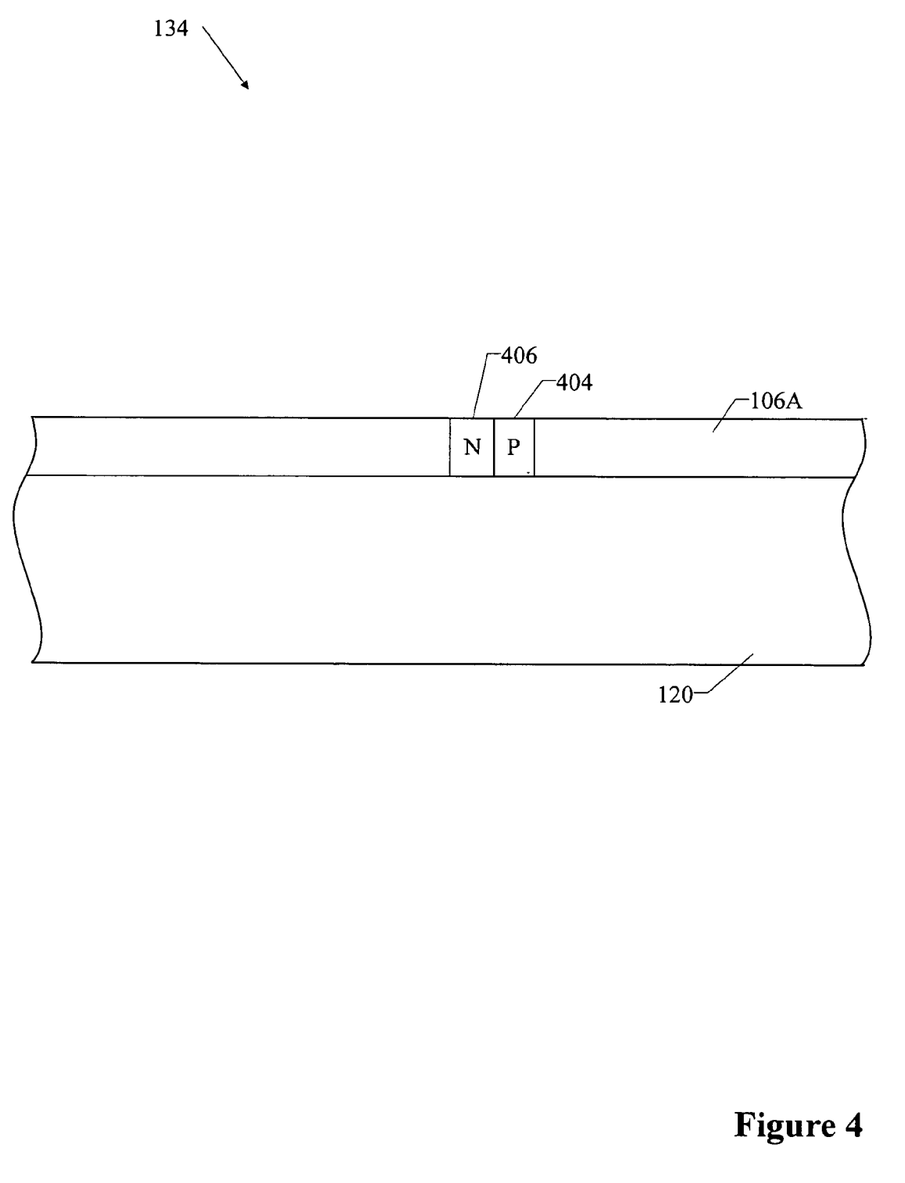
FIG. 4 is a cross sectional view of the system shown in FIG. 3 taken along line 4-4 according to an embodiment of the invention.

There is shown in FIG. 3 a system 300 according to an embodiment of the invention where the effects of crosstalk (e.g., characterization inaccuracy) are reduced by converting the applied signal $V_S$ to a substantially direct current (DC) signal. The alternating current (AC) signal $V_S$ is coupled (e.g., capacitively) to a first portion 350 of the structures 106. The signal is then converted to a substantially DC signal by a converter 320 and coupled to a second portion 352 of the structures.

In an embodiment of the invention, the converters 320 include a rectifier 124 and a low-pass filter 322. The rectifier 124 includes a diode 134, capacitor 132 and resistor 130 and the low-pass filter 322 includes a resistor 128 and capacitor 126. Embodiments of the invention encompass forming the rectifier 124 and/or the low-pass filter 322 or portions thereof integral to the structure. In an embodiment of the invention, the diode is formed in the structure 106 as illustrated by the cross-sectional diagram shown in FIG. 4 taken along line 4-4 in FIG. 3. The diode 134 shown in FIG. 4 includes p-type 404 and n-type 406 semiconductor regions to rectify the signal $V_S$.

Figure 5:
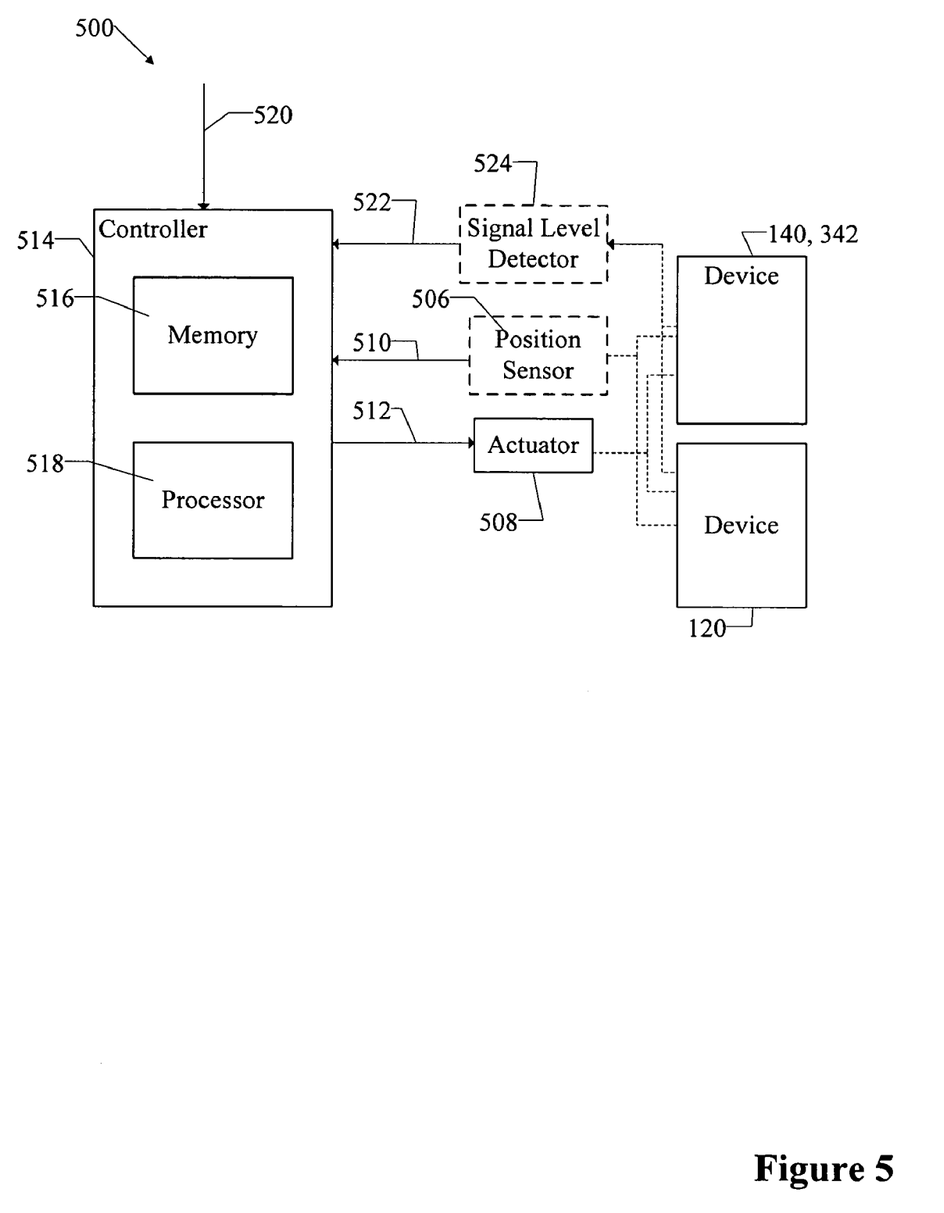
FIG. 5 is a block diagram of a system according to an embodiment of the invention.
Figure 6:
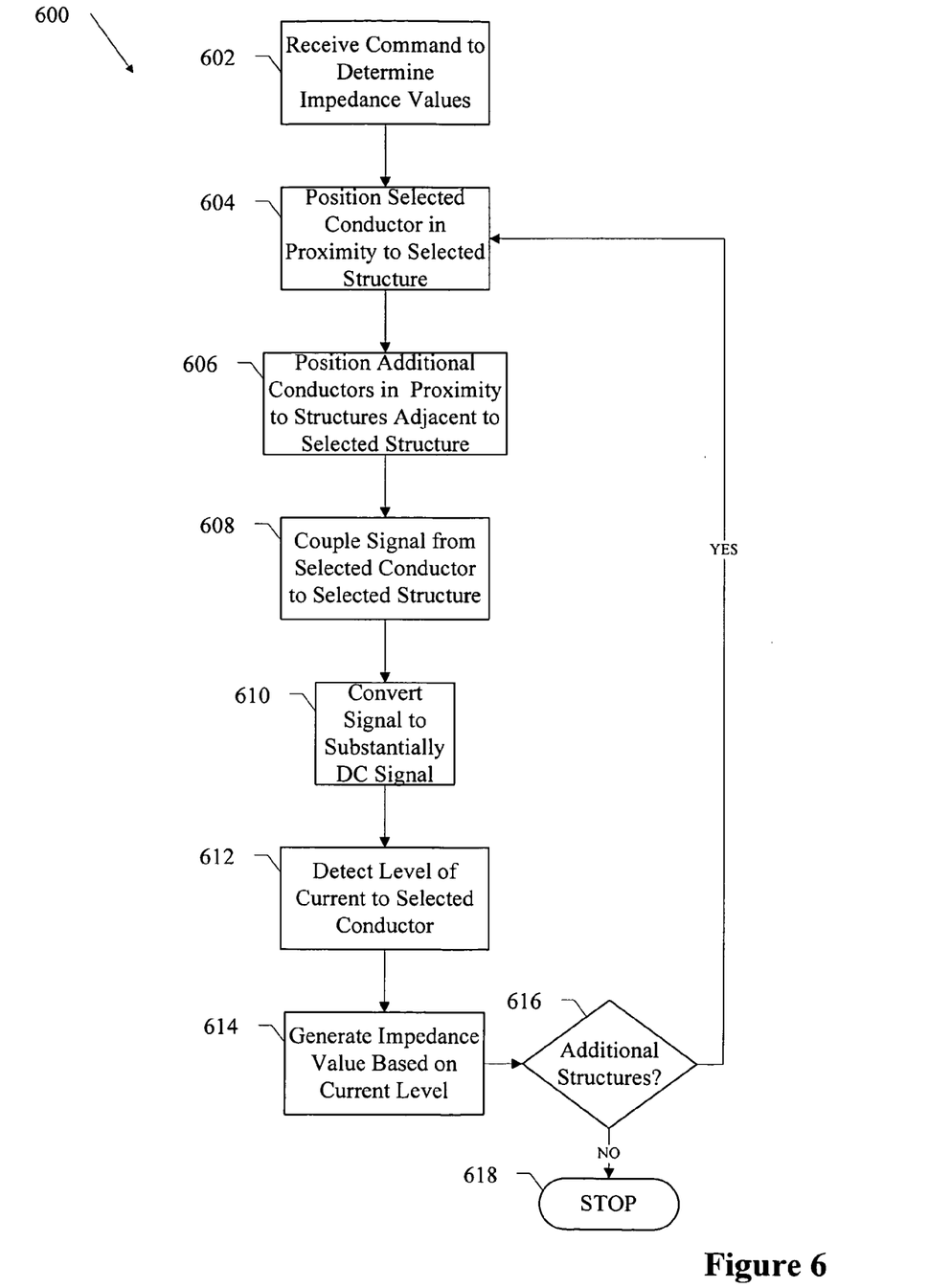
FIG. 6 is a flow chart of a method according to an embodiment of the invention.

There is shown in FIG. 5 a block diagram of a system 500 according to an embodiment of the invention. A flow chart illustrating a method according to an embodiment of the invention is shown in FIG. 6 and is described with reference to the systems 300 and 500 in FIGS. 3 and 5, respectively.

A controller 514 receives a command signal 520 in step 602 to determine the impedance value corresponding to one or more structures (the "selected structure") on a device 120. In response to the command signal 520, in step 604 the controller 514 controls an actuator 508 to displace one or both of the devices 120, 140 to align the selected structure 106C on the first device 120 with a conductor 108 on the second device 140 in response to position information received from a position sensor 506. The position sensor 506 generates a position signal 510 that indicates the relative position of the conductor 108 and the structure 106C. The controller 514 includes a processor 518 that receives and processes the position information in the position signal 510 from the sensor 506 to generate a control signal 512 transmitted to the actuator 508 to control the actuator 508 to displace one or both of the devices 120, 140 in response to the position information received from the position sensor 506 and the command signal 520.

Additional conductors 110 are positioned in alignment with or in proximity to structures (structures 106A,B,D,E,F in the position shown in FIG. 3) adjacent to the selected structure (structure 106C in the position shown in FIG. 3) in step 606. As illustrated in FIG. 3, a plurality of conductors 110 may be included in a single device 342. The device 342 may be actuated as described above to align the conductors 110 with respective structures 106A,B,D,E,F. The devices 120, 140, 342, conductors 108, 110 and structures 106 may be controlled, aligned, and actuated according to the methods and systems described in co-pending U.S. application Ser. No. 11/015,468 entitled SYSTEMS AND METHODS FOR ELECTRICALLY COUPLING WIRES AND CONDUCTORS, which has been incorporated by reference.

A signal is coupled from the conductors 108, 110 to the structures 106 in step 608 and is converted into a substantially DC signal in step 610. A signal level detector 524 detects the level of the signal coupled to the selected structure 106C in step 612 and generates a signal level signal 522 to the controller. In step 614, the controller 514 generates an impedance value based on the signal level signal 522. In an embodiment of the invention, the impedance value is stored in the memory 516. The signal level detector 524 of the embodiment shown in FIG. 5 may correspond to the current sensor 104 shown in FIGS. 1A, 1B, and 3. The measured current flowing into the conductor 106C in FIGS. 1A and 3, or into the conductor 106D in FIG. 1B, then corresponds to the detected signal from the from the device 120 in FIG. 5.

It is determined in step 616 whether there are any additional structures 106 to be characterized. If there are additional structures to characterize, the process repeats beginning with step 604 of positioning a conductor 108 in proximity to the next structure (e.g., 106D) to be characterize. Although the method illustrated with reference to FIG. 6 is described as having "steps" and the different steps are shown in a particular order in the flow chart 600, embodiments of the invention encompass the steps being performed in a different order and/or certain steps being performed in parallel. For example, the conductors 108, 110 may be displaced to positions in proximity to the selected structure 106C and adjacent structures 106 in steps 604 and 606 in parallel.

Although the controller 514, position sensor 506, and actuator 508 are illustrated as being separate from the devices 120, 140, embodiments of the invention encompass one or more of the controller 514, position sensor 506, and actuator 508 being formed on one or both of the devices 120, 140. Although the system 500 is illustrated as having a signal level detector 524 and a separate position sensor 506, embodiments of the invention encompass a single sensor for performing the function of both the signal level detector 524 and the position sensor 506. For example, the current sensor 104 may detect the level of current flowing through the selected structure and the controller may sense alignment when the current level is at a peak level. The same sensor 104 may then be used to determine the impedance of the structure 106C.

Figure 7:
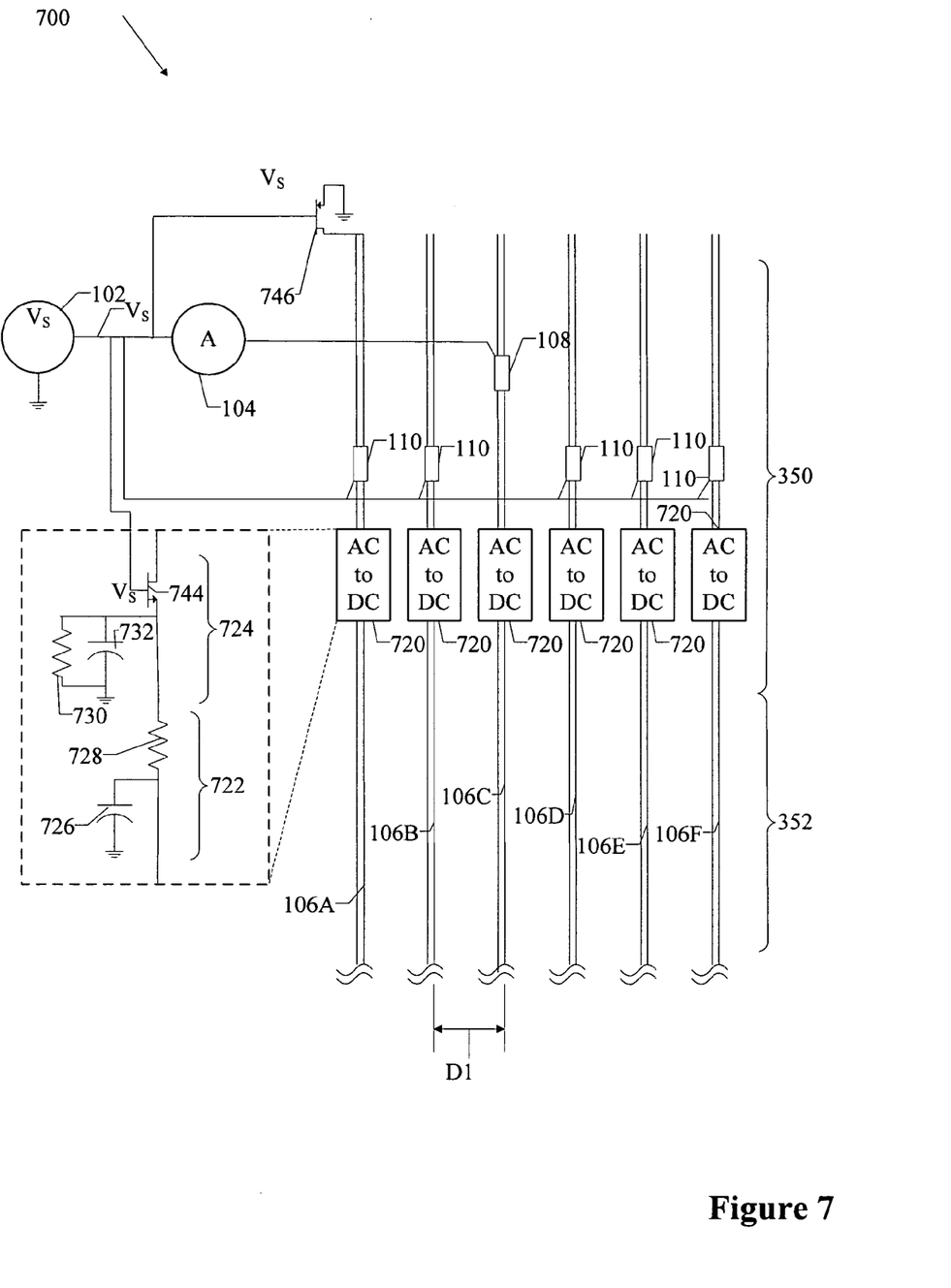
FIG. 7 is a top view of a portion of a system according to an embodiment of the invention.

There is shown in FIG. 7 a system 700 according to another embodiment of the invention. The converters 720 in the system 700 include a rectifier 724 and low-pass filter 722 as in the system 300 shown in FIG. 3. The low-pass filter 722 includes a resistor 728 and a capacitor 726. The rectifier 724 includes a resistor 730, capacitor 732, and one or more field-effect transistors (744). The signal $V_S$ from the source 102 is coupled to the gate of an n-channel field effect transistor (FET) 744. The channel of the FET 744 is substantially conductive during the positive half-cycles of the signal $V_S$ and the channel of the FET 744 is substantially non-conductive during the negative half-cycles of the signal $V_S$. The FET 744 half-wave rectifies the signal $V_S$ that is coupled by the conductor 108 to the first portion 350 of the structure.

In an embodiment of the invention, the system 700 also includes a p-channel FET 746 that also has its gate coupled to the signal $V_S$. On the negative half-cycles of the signal $V_S$, the FET 746 provides a path to ground to discharge any charge that may build up on the capacitor formed between the conductor 108 and the structure 106.

Figure 8:
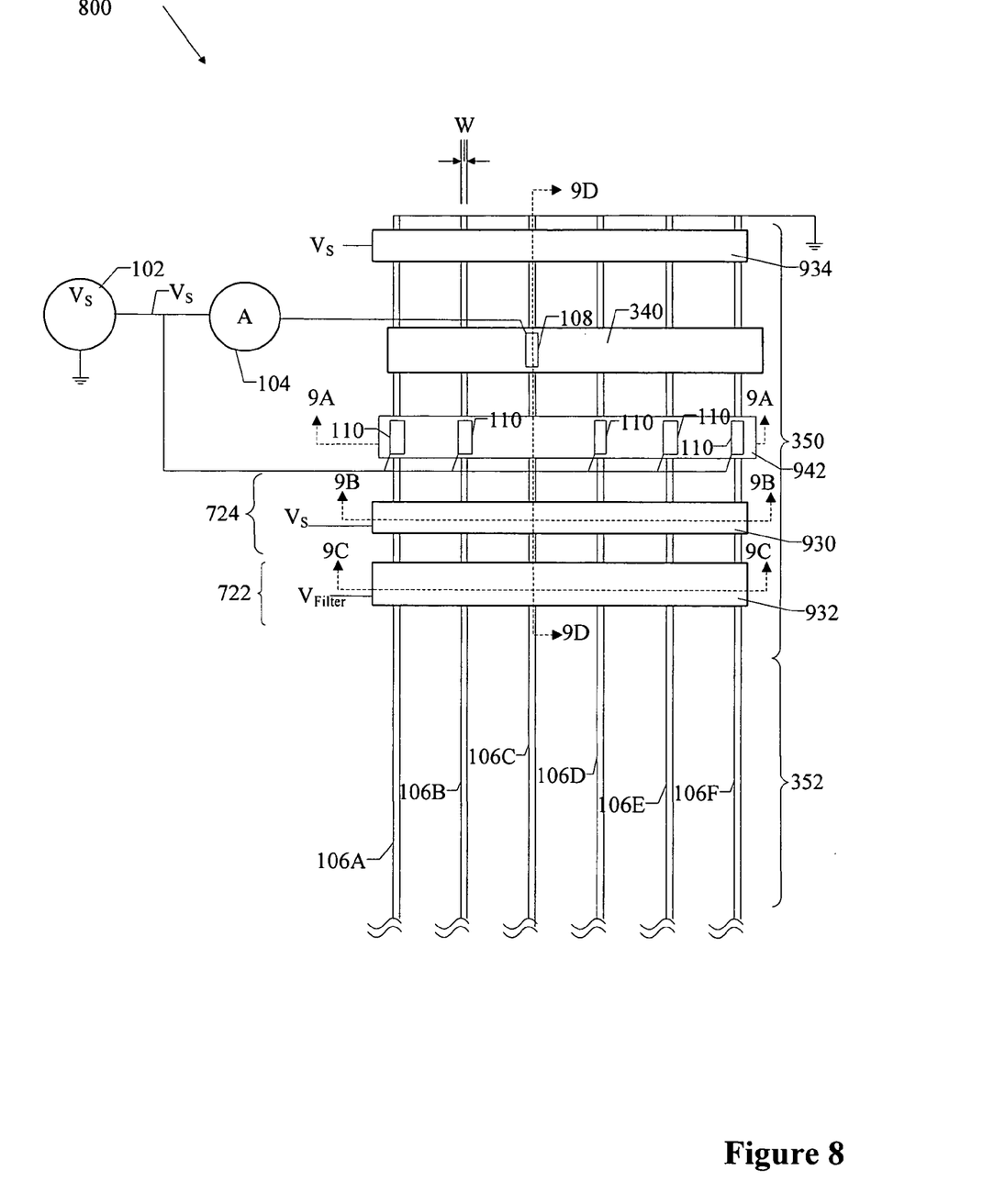
FIG. 8 is a top view of a portion of a system according to an embodiment of the invention.

There is shown in FIG. 8 a top view of a system 800 according to an embodiment of the invention that illustrates an exemplary implementation of the system 700 shown in FIG. 7. The system 800 is described with reference to FIG. 8 and the cross-sectional diagrams taken along lines 9A-9A, 9B-9B, 9C-9C and 9D-9D that are shown in FIGS. 9A-D, respectively.

Figure 9A:
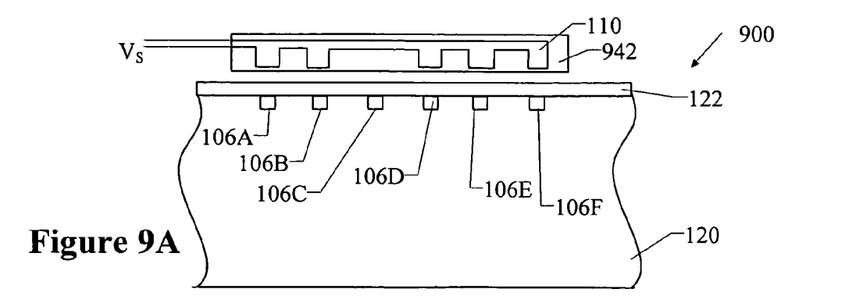
FIGS. 9A-9D are cross sectional views of the system shown in FIG. 8 taken along lines 9A-9A, 9B-9B, 9C-9C, and 9D-9D, respectively, according to an embodiment of the invention.

The system includes a device 942 having a plurality of conductors 110 extending through the device 942 to positions in proximity to corresponding structures 106 on the first device 120. As illustrated in FIG. 9A, a single conductor 110 may span one or more structures on the first device. Although the conductor 108 to be aligned with a selected structure 106 and the conductors 110 to be aligned with other proximate structures 106 are illustrated as being in separate devices, embodiments of the invention encompass the conductors 108, 110 being formed within a single device.

Figure 9B:
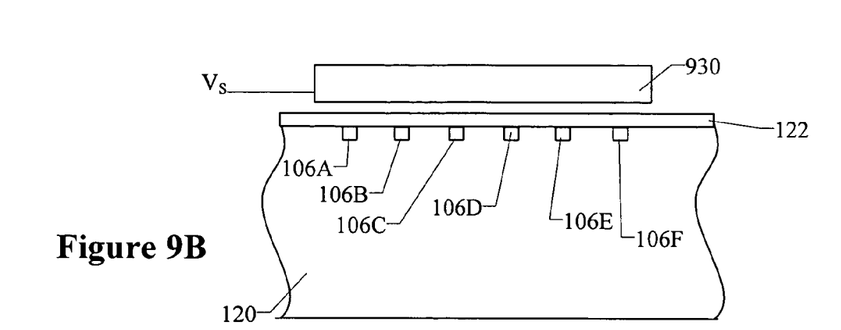

The system 900 in FIGS. 9A-D includes structures that function as the FETs 744, 746 of FIG. 7. The system 900 includes a conductor 930 as illustrated in FIG. 9B that spans a plurality of structures 106 to form the FET 744. The corresponding portion 938 (FIG. 9D) of the structures 106 is a doped n-type semiconductor. When a positive voltage is applied to the conductor 930, the portion 938 of the structure 106 is substantially conductive. When a negative voltage is applied to the conductor 930, the portion 938 of the structure 106 is substantially non-conductive. The signal $V_S$ is coupled to the conductor 930 and to the structure 106C (via the conductor 108) resulting in the signal $V_S$ applied to the structure 106C being half-wave rectified. The intrinsic capacitance formed by the conductor 930 relative to the structures 106 provides the capacitance (e.g., 732) of the rectifier and an intrinsic resistance path to ground may serve as the resistor 730.

Figure 9C:
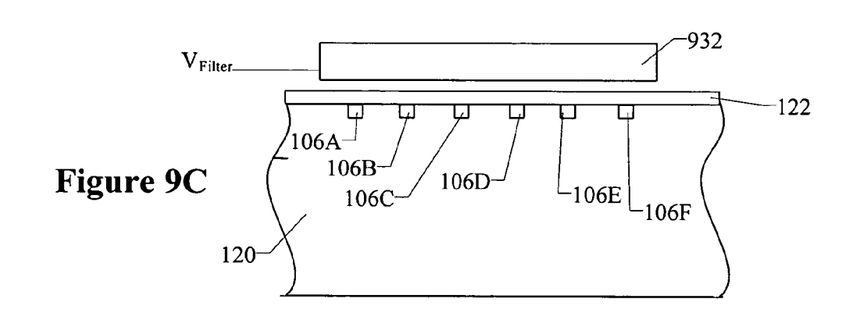
Figure 9D:
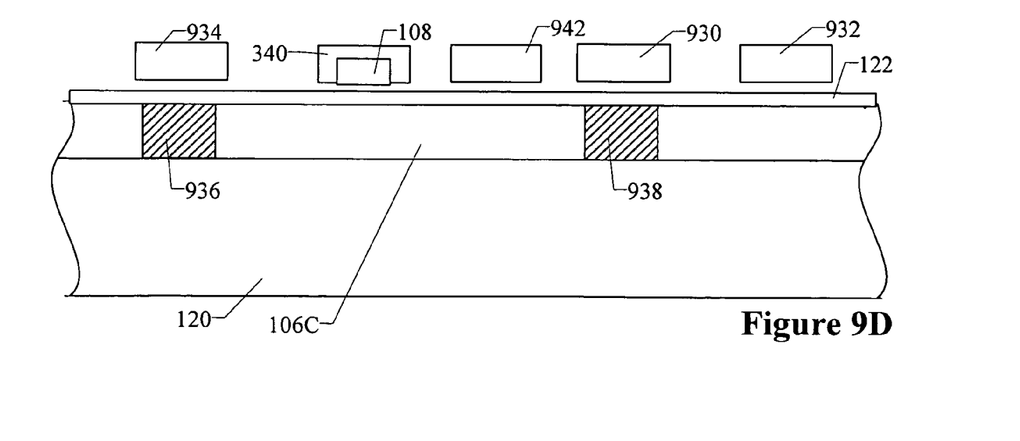

Similarly, a FET is formed using another conductor 934 in conduction with a p-type semiconductor region 936 (FIG. 9D). The region 936 is conductive during the negative portion of the signal $V_S$ in order to provide a path to ground as described above with regard to FET 746 in FIG. 7.

The n and p type channel FETs 744 and 746 and semiconductor regions 936 and 938 can of course be of the opposite type. The FETs 744 and 746 and semiconductor regions 936 and 938 can of course be connected so that they are substantially conductive during the opposite half cycles to those described above.

The low-pass filter 722 is formed using a conductor 932 (FIG. 9C). A DC potential or ground (identified by $V_{Filter}$ in FIGS. 8 and 9) is applied to the conductor 932 which spans a plurality of structures 106. The conductor 932 generates a capacitance between the structures 106 and the conductor 932 that serves as the capacitor 726 of the low-pass filter 722. The resistance 728 of the low-pass filter may be achieved by the internal resistance of the structure 106.

The signal $V_S$ is coupled to the first portion 350 of the structure 106C in FIG. 8 and is converted into a substantially DC signal in the first portion 350, and the substantially DC signal is provided to the second portion 352 of the structure 106C. The effect of crosstalk is reduced or eliminated in the second portion 352 of the structure 106C because the signal is substantially a DC signal in the second portion 352 of the structure 106C. However, the signal in at least part of the first portion 350 of the structure 106 is AC and the risk of crosstalk is greater than in the second portion 352. As described above, the risk of crosstalk is increased if the structures have different impedances. The risk of crosstalk is reduced if the first portion 350 of the structures 106 has low impedance. In an embodiment of the invention, in at least the first portion 350 of the structures 106, the structures 106 are sealed to prevent contamination which may affect their impedance. In an embodiment of the invention, the first portion 350 of a structure 106 is sealed by a dielectric layer 122.

In an embodiment of the invention, the system 800 is used to detect the presence of particles on the second portions 352 of the structures 106. As particles land or are placed on the structures 106, the impedance of the structures 106 will vary based on the number of particles landing on a structure 106. If the variation of impedance resulting from each particle is known, the number of particles may be calculated based on the determined impedance. At low particle fluxes, the number of particles may be measured by counting individual particle detection events. The impedance of each structure 106A, 106B, 106C, 106D, 106E, 106F may be determined as described above to determine the number of particles on each structure. Each of the structures 106A, 106B, 106C, 106D, 106E, 106F may be configured to be sensitive to one or more kinds of particle. In certain embodiments, the sensing mechanism may operate only with a DC current.

The foregoing describes the invention in terms of embodiments foreseen by the inventors for which an enabling description was available, although insubstantial modifications of the invention, not presently foreseen may nonetheless represent equivalents thereto.

What is claimed is:

1. A system comprising:
   a first device having a plurality of at largest micrometer-scale geometry structures, the structures having a first portion and a second portion;
   a plurality of at largest micrometer-scale geometry conductors coupled to the first portion of respective structures;
   a converter for converting a signal in the first portion of the structures to a substantially direct current signal in the respective second portion, wherein the converter has a rectifier and a low-pass filter; and
   a sensor for detecting a level of a signal coupled from one of the conductors to a respective one of the structures.

2. The system according to claim 1 wherein the first device has a surface and the plurality of at largest micrometer-scale geometry structures extend along the surface.

3. The system according to claim 1 comprising conductors coupled to structures adjacent to the respective one of the structures.

4. The system according to claim 1, wherein structures adjacent to the respective one of the structures are not coupled to conductors and wherein structures adjacent to the adjacent structures are coupled to the conductors.

5. The system according to claim 1 comprising a signal source coupled to the conductors.

6. The system according to claim 1 wherein the conductors are capacitively coupled to the respective structures.

7. The system according to claim 1 comprising an actuator for displacing the conductors and structures relative to each other.

8. The system according to claim 7, wherein the actuator electrostatically displaces the conductors and the structures relative to each other.

9. The system according to claim 7, comprising a sensor for detecting relative alignment of the conductors and structures and a controller for controlling the actuator in response to the detected alignment.

10. The system according to claim 1, wherein the filter includes a conductor at a substantially fixed potential capacitively coupled to the first portion of the structures.

11. The system according to claim 1, wherein the rectifier has a diode formed in the structure.

12. The system according to claim 1, wherein the rectifier has a transistor formed in the structure.

13. The system according to claim 12, wherein the transistor is a field-effect transistor.

14. The system according to claim 1 wherein the sensor detects a level of electrical current.

15. The system according to claim 1 wherein the sensor is coupled to the conductor for detecting a level of the signal.

16. The system according to claim 1 wherein the first portion of the structures is sealed.

17. The system according to claim 16 wherein the first portion of the structures is sealed by a dielectric.

18. The system according to claim 1 wherein the structures are nanometer scale structures.

19. The system according to claim 18 wherein the structures have a width less than or equal to 100 nm.

20. The system according to claim 18 wherein the structures have a width less than or equal to 10 nm.

21. The system according to claim 1 comprising a controller for generating an impedance value corresponding to a respective one of the structures in response to the level of the signal detected by the sensor.

22. The system according to claim 1 comprising a controller for successively with respect to each of the structures, controlling the actuator to align one of the conductors with one of the structures and generate an impedance value of the one of the structures in response to the level of the signal detected by the sensor.

23. A system comprising:
- a first device having a plurality of at largest micrometer-scale geometry structures, the structures having a first portion and a second portion;
- a plurality of at largest micrometer-scale geometry conductors coupled to the first portion of respective structures;
- means for converting a signal in the first portion of the structures to a substantially direct current signal in the respective second portion;
- means for detecting a level of a signal coupled from one of the conductors to a respective one of the structures; and
- means for displacing the conductors and structures relative to each other.

24. The system according to claim 23, wherein the first device has a surface and the plurality of at largest micrometer-scale geometry structures extend along the surface.

25. The system according to claim 23 comprising means for detecting relative alignment of the conductors and structures and means for controlling the means for displacing the conductors and structures relative to each other in response to the detected alignment.

26. The system according to claim 23 comprising means for processing the level of the signal detected by the means for detecting a level of signal and generating an impedance value of the respective one of the structures.

27. A method for determining the impedance of one of a plurality of adjacent at largest micrometer-scale geometry structures, the structures each having a first portion and a second portion, comprising:
- coupling a plurality of at largest micrometer-scale geometry conductors to the first portions of respective structures wherein a signal is transmitted from the conductors to the first portions of the respective structures;
- converting the signal in the first portion of each of the structures to a substantially direct current signal in the respective second portion;
- detecting a level of a signal coupled from one of the conductors to a respective one of the structures; and
- generating an impedance value corresponding to the respective one of the structures in response to the detected level of the signal.

28. The method according to claim 27, wherein the first device has a surface and the plurality structures extend along the surface.

29. The method according to claim 27 comprising calculating an impedance of the respective one of the structures in response to the detected level of the signal.

30. The method according to claim 27 comprising displacing the conductors and structures relative to each other.

31. The method according to claim 30 wherein the conductors and the structures are electrostatically displaced relative to each other.

32. The method according to claim 27 comprising detecting relative alignment of the conductors and structures and controlling the actuator in response to the detected alignment.

33. The method according to claim 27 wherein the signal is convened by rectifying and low-pass filtering the signal.

34. The method according to claim 27 comprising generating an impedance value corresponding to the respective one of the structures in response to the detected level of the signal.

35. The method according to claim 27 comprising successively with respect to each of the structures, aligning one of the conductors with one of the structures, processing the level of the signal detected and generating an impedance value of the one of the structures.

36. A method of determining an amount of particles on a surface of a device having a plurality of at largest micrometer-scale geometry structures extending along the surface of the device comprising:
- coupling a plurality of at largest micrometer-scale geometry conductors to first portions of respective structures wherein a signal is transmitted from the conductors to the first portions of the respective structures;
- converting the signals in the first portions of the structures to substantially direct current signals in respective second portions of the structures;
- detecting a level of the signal transmitted to the first portion of one of the structures;
- generating an impedance value corresponding to the one of the structures in response to the detected level of the signal; and
- generating a particle amount value corresponding to the impedance value.

37. The method according to claim 36 comprising transmitting an AC signal to the one structure and converting the signal to a substantially DC signal.

* * * * *

UNITED STATES PATENT AND TRADEMARK OFFICE
CERTIFICATE OF CORRECTION

| | | |
|---|---|---|
| PATENT NO. | : 7,429,864 B2 | Page 1 of 1 |
| APPLICATION NO. | : 11/015060 | |
| DATED | : September 30, 2008 | |
| INVENTOR(S) | : Carl E. Picciotto et al. | |

It is certified that error appears in the above-identified patent and that said Letters Patent is hereby corrected as shown below:

In column 10, line 13, in Claim 33, delete "convened" and insert -- converted --, therefor.

Signed and Sealed this

Twenty-eighth Day of April, 2009

JOHN DOLL
*Acting Director of the United States Patent and Trademark Office*